United States Patent
Takase et al.

(10) Patent No.: US 6,438,826 B2
(45) Date of Patent: Aug. 27, 2002

(54) ELECTRONIC COMPONENT, METHOD OF SEALING ELECTRONIC COMPONENT WITH RESIN, AND APPARATUS THEREFOR

(75) Inventors: Shinji Takase; Hirotaka Okamoto; Michio Osada; Kouichi Araki, all of Kyoto (JP)

(73) Assignee: Towa Corporation, Kyoto (JP)

( * ) Notice: Subject to any disclaimer, the term of this patent is extended or adjusted under 35 U.S.C. 154(b) by 0 days.

(21) Appl. No.: 09/777,787

(22) Filed: Feb. 5, 2001

(30) Foreign Application Priority Data

Feb. 10, 2000 (JP) .......................................... 2000-034248

(51) Int. Cl.[7] .............................................. H05K 13/00
(52) U.S. Cl. ............................... 29/855; 29/829; 29/831; 174/200; 257/787; 438/166
(58) Field of Search ............................. 174/260; 29/830, 29/829, 831, 832, 855; 257/778, 787; 361/760; 438/106

(56) References Cited

U.S. PATENT DOCUMENTS

| | | | | |
|---|---|---|---|---|
| 4,993,148 A | * | 2/1991 | Adachi et al. | .............. 174/260 |
| 5,706,579 A | * | 1/1998 | Ross | ............................ 29/840 |
| 6,105,245 A | * | 8/2000 | Furukawa | ..................... 29/855 |

FOREIGN PATENT DOCUMENTS

| JP | 405121872 | * | 5/1993 | ................. 28/829 |

* cited by examiner

Primary Examiner—Albert W. Paladini
(74) Attorney, Agent, or Firm—W. F. Fasse; W. G. Fasse

(57) ABSTRACT

A resin seal apparatus includes a movable bottom die vertically moved by an elevator mechanism, a transport mechanism horizontally moving the movable bottom die having placed thereon a printed circuit board with a semiconductor chip mounted thereon, an intermediate die abutting against a periphery of the printed circuit board when the movable bottom die is moved upward, a film of resin stretched by a film stretch mechanism over the intermediate die and the printed circuit board, a die for a chip, pressing a back surface of the semiconductor chip via the film of resin, and a top die pressing a top surface of the intermediate die via the film of resin. This apparatus allows a PCB with a semiconductor chip mounted thereon in the form of a flip chip to be sealed with resin in a reduced period of time to fabricate an electronic component.

14 Claims, 14 Drawing Sheets

ELECTRONIC COMPONENT, METHOD OF SEALING ELECTRONIC COMPONENT WITH RESIN, AND APPARATUS THEREFOR

BACKGROUND OF THE INVENTION

1. Field of the Invention

The present invention relates generally to electronic components, methods of sealing electronic components with resin and apparatus therefor, and particularly to electronic components including a semiconductor chip mounted on a printed circuit board in the form of a flip chip, methods of sealing the same with resin and apparatus therefor.

2. Description of the Background Art

Conventionally a semiconductor chip is mounted on a glass epoxy board or a similar printed circuit board (hereinafter referred to as a PCB) in the form of a flip chip and then sealed with resin to produce an electronic component in such a process as follows: initially, a PCB with a semiconductor chip mounted thereon is placed on a stage. Then, a dispenser is used to apply a thermosetting resin having liquid phase cold, such as epoxy resin, along one side of the semiconductor chip. The epoxy resin permeates through capillarity into the entirety of a gap formed between the PCB and the semiconductor chip and also forms a fillet along another side of the semiconductor chip. Then the resin is heated and cured. Thus a resin mold is formed in the gap between the PCB and the semiconductor chip and in a region extending along each side of the semiconductor chip.

Sealing a flip chip with resin, as conventional, however, is disadvantageous; first of all, utilizing capillarity to allow epoxy resin to permeate into the entirety of a gap provided between a PCB and a semiconductor chip, is time consuming and thus increases the process time. Furthermore, the resin seal may have dimensions with insufficient precision. Such disadvantages are increasingly serious as in recent years electronics are reduced in weight, thickness and size and accordingly there exists an increasing demand for electronic components reduced in size. More specifically, a PCB and a semiconductor chip have therebetween further smaller a gap and the PCB and the semiconductor chip have their respective electrodes electrically connected via bumps further increased in number, and allowing epoxy resin to permeate thus requires a long period of time. Furthermore, as an electronic component is reduced in size it is required to have a dimension with high precision.

Secondly, although gradually cold, thermosetting resin having liquid phase cold cures and thus varies in viscosity while it is used. As such, its delivery rate must be monitored constantly and the resin thus has a poor level of workability. Furthermore, there are constraints in handling thermosetting resin. For example, if thermosetting resin having liquid phase cold is stored it must be stored in an atmosphere of no more than −40° C. and when it is used it must be used cold. In addition, thermosetting resin having liquid phase cold is more expensive than that having solid phase cold which is used in normal transfer-molding.

SUMMARY OF THE INVENTION

The present invention contemplates a high-quality electronic component, a method of sealing the electronic component with resin in a reduced period of time and a resin seal apparatus, wherein in transfermolding, a liquid, thermosetting resin is introduced.

To achieve the above object the present invention provides an electronic component including a printed circuit board, a semiconductor chip mounted on the printed circuit board and a bump electrically connecting the printed circuit board and the semiconductor chip together, and between the printed circuit board and the semiconductor chip at a predetermined location there is provided a resin seal integrally. On at least one of a surface of the printed circuit board and a surface of the semiconductor chip opposite to the surface of the printed circuit board there is provided a protrusion dimensioned to protrude to have a height no more than the bump.

As such in the step of sealing the chip with resin when melted resin is heated and cured if the bump softens the pressure received via the semiconductor chip can be distributed to and applied on not only the bump but the protrusion and the printed circuit board and the semiconductor chip would never have a gap therebetween smaller in dimension than the height of the protrusion. This can prevent such defects as deformation of a softened bump, short circuit between adjacent bumps, and the like.

Furthermore the present invention provides a method of sealing an electronic component with resin, wherein a semiconductor chip mounted on a printed circuit board is sealed with resin to fabricate the electronic component, including the steps of: preparing a resin molding die divided into a main die and an intermediate die opened and closed, as desired, relative to the main die in arrangement; setting in any of the main die at a predetermined position the printed circuit board with the semiconductor chip mounted thereon; closing the main die with the semiconductor chip set therein and the intermediate die together, and also adjoining together the intermediate die and a periphery of the printed circuit board in the main die to clamp the molding die; after the step of closing and adjoining, stretching a mold release film over a back surface of the semiconductor chip and a front surface of the intermediate die; after the step of stretching, closing together another main die and the intermediate die with the mold release film posed therebetween, to further clamp the molding die; pressing the mold release film into close contact with the back surface of the semiconductor chip; at the step of closing together another main die and the intermediate die and the step of pressing, introducing melted resin into a cavity and curing the introduced resin therein to seal with the resin the semiconductor chip mounted on the printed circuit board, the cavity being defined by the printed circuit board, the intermediate die and the mold release film; after the semiconductor chip is molded with resin, opening the molding die; and removing the mold release film stretched across the back surface of the semiconductor chip and the front surface of the intermediate die.

Since melted resin introduced into a cavity is cured to form a resin seal, the resin seal can be formed in a shorter period of time than when capillarity is employed. Furthermore, the melted resin can be introduced into a cavity defined by a film of resin, the intermediate die and the printed circuit board and even if the melted resin has low viscosity it can be prevented from entering a gap provided between the group of dies and the intermediate die.

Furthermore the present invention in one embodiment provides the present method with the step of closing another main die and the intermediate die and the step of pressing performed separately.

As such the semiconductor chip can be pressed with appropriate pressure. Thus the bump of solder can be free from pressure otherwise applied more than required and thus softening and deforming the bump. Furthermore, with the film of resin interposed the die for a chip can initially press the semiconductor chip and the top die can then press the intermediate die. As such, the film of resin can be free of wrinkle in a region defining the cavity. As such the resultant electronic component can aesthetically be less defective.

Furthermore the present invention in a preferred embodiment provides the present method wherein the intermediate die and another main die are closed together by adjoining their respective surfaces inclined or similarly unleveled, as required, to allow the dies, when closed together, to remove a wrinkle of at least the mold release film stretched across the back or heat-sink surface of the semiconductor chip.

As such before the dies are completely closed the inclinations sandwich the film of resin and thus stretch it tight. This ensures that the film of resin can be free of wrinkle in a region defining the cavity. Thus the resultant electronic component can aesthetically be less defective.

Furthermore the present invention provides the present method preferably further including the step of internally vacuuming at least the cavity before the step of introducing.

The cavity previously vacuumed can receive melted resin with low pressure. This allows less viscous melted resin to be used. As such, if the printed circuit board and the semiconductor chip have a small gap therebetween and there are also a large number of bumps the resin can reliably underfill the semiconductor chip provided in the form of a flip chip. In addition the present feature can advantageously limit occurrence of a void in a resultant resin seal.

The present invention provides an apparatus sealing an electronic component with resin, wherein a semiconductor chip mounted on a printed circuit board is sealed with resin to fabricate the electronic component, including: a resin molding die divided into a main die and an intermediate die opened and closed, as desired, relative to the main die in arrangement; a PCB feed and set mechanism feeding and setting in any main die at a predetermined position the printed circuit board having the semiconductor chip mounted thereon; a first clamp mechanism closing the main die with the semiconductor chip set therein and the intermediate die together, and also adjoining the intermediate die and a periphery of the printed circuit board set in the main die; a film stretch mechanism stretching a mold release film over a back or heat-sink surface of the semiconductor chip mounted on the printed circuit board set in the main die at the predetermined position and over a front surface of the intermediate die; a second clamp mechanism closing together another main die and the intermediate die with the mold release film posed therebetween; a resin seal mechanism introducing melted resin into a cavity with the first and second clamp mechanisms clamping the molding die, and curing the introduced resin therein to seal with the resin the semiconductor chip mounted on the printed circuit board, the cavity being defined by the printed circuit board, the intermediate die and the mold release film; and a PCB transport mechanism transporting a resin-molded product from the predetermined position in the main die of the molding die opened to output the resin-molded product from the molding die.

The present apparatus can introduce melted resin into the cavity and cure it therein to form a resin seal. As such, the present apparatus can provide the resin seal in a shorter period of time than when capillarity is employed. Furthermore, the melted resin is introduced into the cavity defined by the film of resin, the intermediate die and the printed circuit board and if the melted resin has low viscosity it can be prevented from entering a gap provided between the group of dies and the intermediate die.

The present invention in a preferred embodiment provides the present apparatus further including a die for a chip, pressing the mold release film into close contact with the back surface of the semiconductor chip, i.e., a heat-sink surface thereof.

Thus the semiconductor chip can be pressed with appropriate pressure. As such, the bump can be free from pressure otherwise applied more than required and thus softening and deforming the bump when the introduced melted resin is heated and cured to form a resin seal.

Furthermore the present invention provides the present apparatus preferably further including a portion provided to remove a wrinkle of at least the mold release film stretched across the back surface of the semiconductor chip mounted on the printed circuit board. The portion corresponds to the intermediate die and another main die each having a surface unleveled, as required, adjoined each other to remove the wrinkle of the mole release film.

As such before the dies are completely closed the inclinations sandwich the film of resin and stretch it tight. This ensures that the film of resin can be free of wrinkle in a region defining the cavity. Thus the present apparatus can provide an aesthetically less defective electronic component.

The present invention in another preferable embodiment provides the present apparatus further including a vacuum mechanism vacuuming the cavity.

The cavity previously vacuumed can receive melted resin with low pressure. This allows less viscous melted resin to be used. As such, if the printed circuit board and the semiconductor chip have a small gap therebetween and there are also a large number of bumps the apparatus still can reliably underfill with the resin the semiconductor chip provided in the form of a flip chip. In addition the present feature can advantageously limit occurrence of a void in a resultant resin seal.

The present invention provides a method of introducing resin for a flip chip, the flip chip being formed of a semiconductor chip and a printed circuit board connected together via a bump, the flip chip being set in a resin molding die at a predetermined position, the resin being introduced into a gap provided between the semiconductor chip and the printed circuit board, comprising the steps of: with the printed circuit board and the semiconductor chip each having a surface covered with a mold release film, fitting the semiconductor chip into a cavity of the molding die to set the semiconductor chip therein; adjoining opposite parting surfaces of the molding die together to close the molding die; introducing fluid pressure into the cavity and exerting the fluid pressure via a mold release film onto at least a member attaching surface of the semiconductor chip in the cavity to press the mold release film into close contact with the member attaching surface; after the mold release film is pressed into close contact with the member attaching surface, pressurizing and thus introducing a molding source material of resin into the cavity to cover with the resin a surface of the semiconductor chip excluding at least the member attaching surface and fill with the resin a gap provided between the semiconductor chip and the printed circuit board.

As such, the resin can be efficiently introduced into and thus fill a gap provided in the flip chip between the semiconductor chip and the printed circuit board. Thus not only can productivity be increased but the present feature can effectively prevent melted source material of resin from adhering to the semiconductor chip on a member attaching surface thereof, such as a heat sink, when the resin is introduced to fill the gap between the semiconductor chip and the printed circuit board.

The present invention in one embodiment provides the method of introducing resin for a flip chip, wherein in the step of introducing, the fluid is gas applying pressure toward a surface of the semiconductor chip via the mold release film to press the mold release film into close contact with the semiconductor chip at at least the member attaching surface.

Furthermore the present invention in another embodiment provides the method of introducing resin for a flip chip, wherein in the step of introducing, the fluid pressure is pressure applied to mold resin, the pressure applied to mold resin being applied toward a surface of the semiconductor chip via the mold release film to press the mold release film into close contact with the semiconductor chip at at least the member attaching surface.

Furthermore the present invention in a preferable embodiment provides the method of introducing resin for a flip chip, wherein in the step of introducing, the fluid pressure is adapted to be adjustable to correspond to pressure applied to introduce resin in the step of pressurizing and introducing.

Furthermore the present invention provides the method of introducing resin for a flip chip, wherein the step of pressurizing and introducing preferably includes the step of internally vacuuming a portion to be filled with resin, including at least a die cavity.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
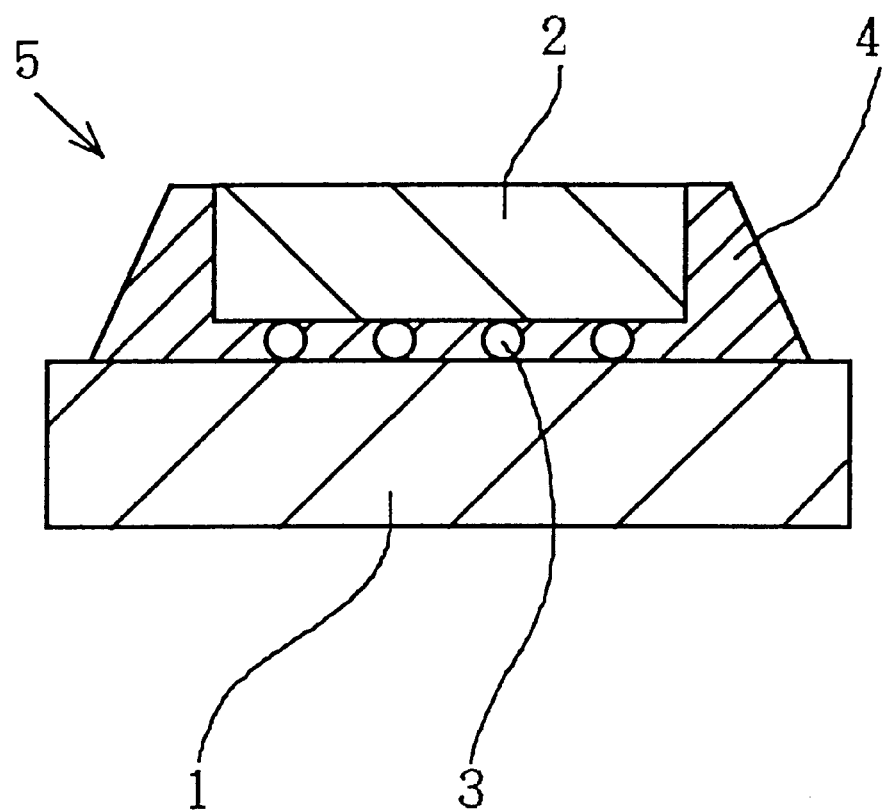
FIG. 1 is a cross section of an electronic component in a first embodiment of the present invention.

A first embodiment of the present invention provides an electronic component, as described with reference to FIG. 1. The present embodiment provides an electronic component 5 including a PCB 1 formed for example of glass epoxy and a semiconductor chip mounted on PCB 1. PCB 1 and semiconductor chip 2 have their respective electrodes (not shown) electrically connected together via a bump 3 formed for example of solder. PCB 1 and semiconductor chip 2 have therebetween a gap provided with a resin seal covering a side surface of semiconductor chip 2 while exposing a back surface of semiconductor chip 2, i.e., a surface thereof free of bump 3 connected thereto. Resin seal 4 is formed by introducing and curing melted resin in a cavity (not shown) defined by closing a molding die (not shown) to contain semiconductor chip 2. PCB 1, semiconductor chip 2, bump 3 and resin seal 4 together configure electronic component 5.

Figure 2:
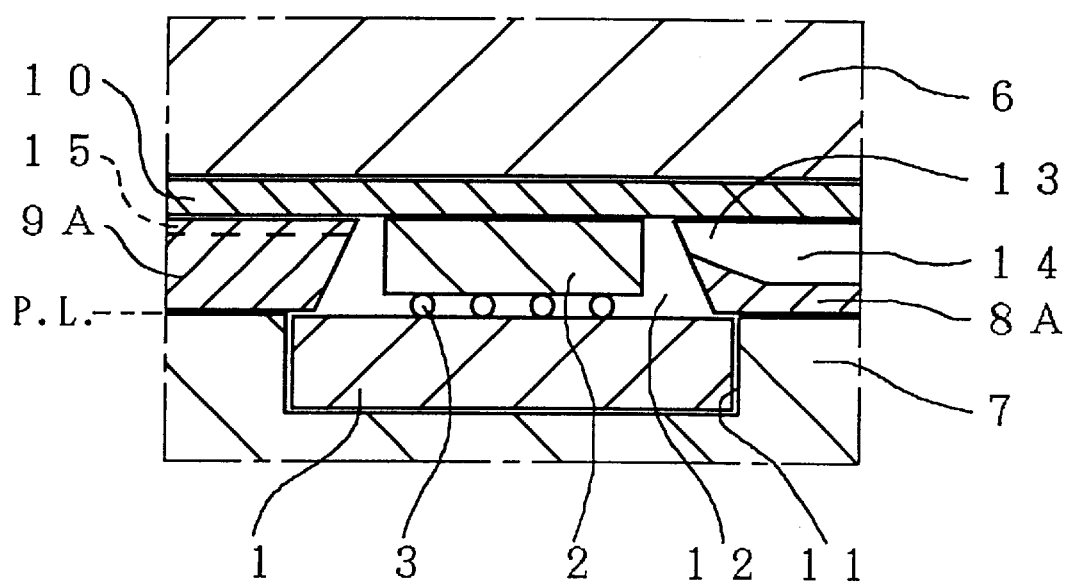
FIG. 2 is a cross section of a resin seal apparatus of the first embodiment in a closed position.

Reference will now be made to FIG. 2 to describe a resin seal apparatus sealing the FIG. 1 electronic component with resin.

The present resin seal apparatus, as shown in FIG. 2, includes a top die 6 and a bottom die 7 configuring a group of resin sealing dies. Between top die 6 and bottom die 7 there exist intermediate dies 8A and 9A laterally advancing and retreating, as desired, and contacting an upper peripheral surface of PCB 1 when the intermediate die advances. A resin film 10 is stretched tight in contact with an upper surface of intermediate die 8A and that of intermediate die 9A and a back surface of semiconductor chip 2. Bottom die 7 is provided with a recess 11 receiving PCB 1. A cavity 12 is a space defined by PCB 1, intermediate dies 8A and 9A and resin film 10. It receives semiconductor chip 2, although spaced, as predetermined, from a side surface of semiconductor chip 2. Intermediate die 8A is provided with a gate 13 introducing melted resin (not shown) into cavity 12, and a resin channel 14 passing the melted resin toward gate 13. Intermediate die 9A is provided with an air vent 15 communicating with cavity 12.

Although not shown in FIG. 2, the present resin seal apparatus also includes a pot accommodating a solid, resin tablet and a plunger exerting pressure on melted resin produced by heating the resin tablet to feed the melted resin to resin channel 14. There are also provided a film stretch mechanism having a reel and driver to feed and stretch resin film 10 tight and wind up the film used. In addition, there is also provided a transport mechanism provided to suck an electronic component sealed with resin, extract it from recess 11 and transport it to a predetermined position.

Figure 3A:
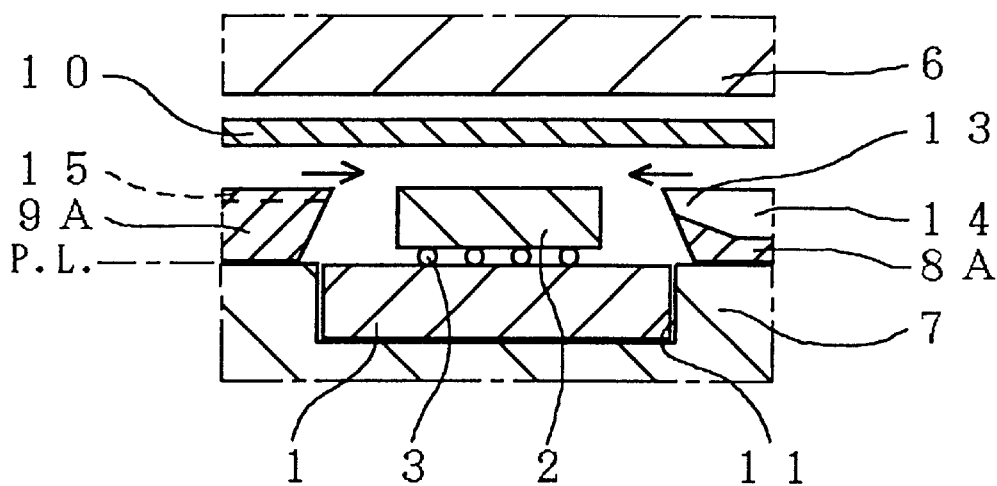
FIGS. 3A–3C are cross sections illustrating a process provided by the FIG. 2 apparatus from the step of moving an intermediate die through the step of moving a top die downward.
Figure 3B:
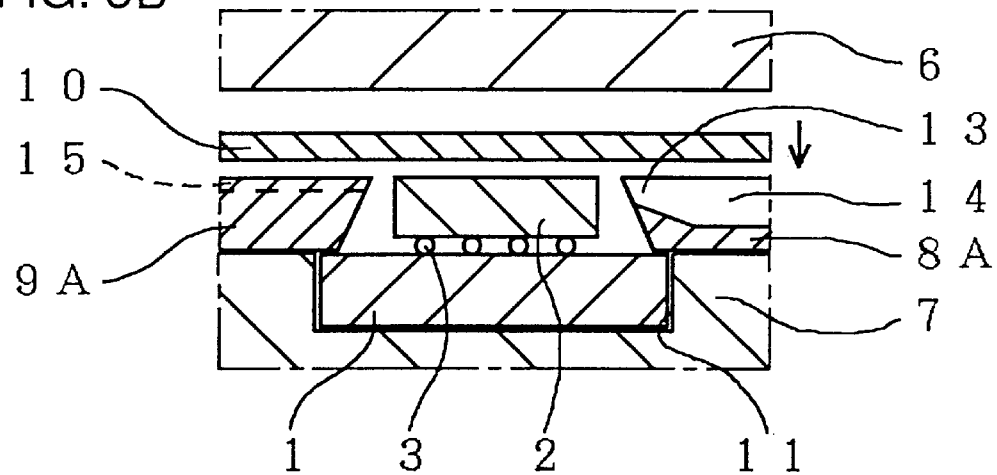
Figure 3C:
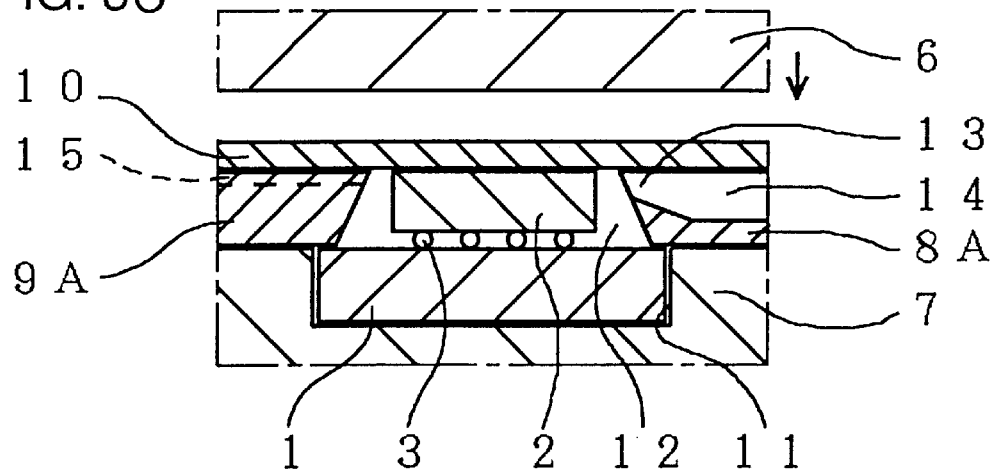

The FIG. 2 apparatus operates as described with reference to FIGS. 3A–4C. FIGS. 3A–3C are cross sections showing process steps provided by the present resin seal apparatus, from the step of moving the intermediate dies through the step of moving the top die downward.

Initially, as shown in FIG. 3A, with top die 6 and bottom die 7 opened, PCB 1 with chip 2 mounted thereon via bump 3 is placed in recess 11. Then, intermediate dies 8A and 9A moves along the bottom die 7 parting plane toward semiconductor chip 2.

Then, as shown in FIG. 3B, intermediate dies 8A and 9A contact PCB 1 on an upper peripheral surface thereof and stop to be spaced, as predetermined, from a side surface of semiconductor chip 2 and resin film 10 is then moved downward.

Then, as shown in FIG. 3C, with resin film 10 brought into contact with a back surface of semiconductor chip 2 and an upper surface of intermediate die 8A and that of intermediate die 9A and also stretched tight, top die 6 moves downward to clamp top die 6 and bottom die 7 together.

Figure 4A:
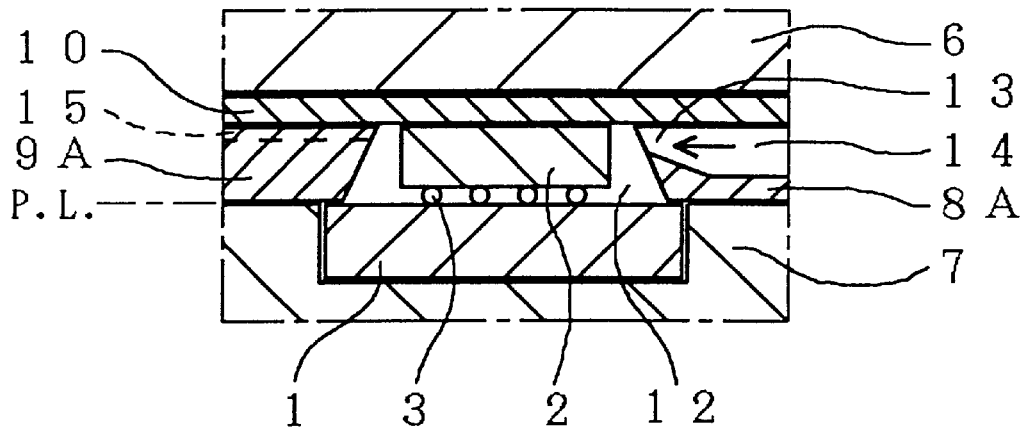
FIGS. 4A–4C are cross sections showing a process provided by the FIG. 2 apparatus from the step of introducing melted resin through the step of outputting an electronic component.
Figure 4B:
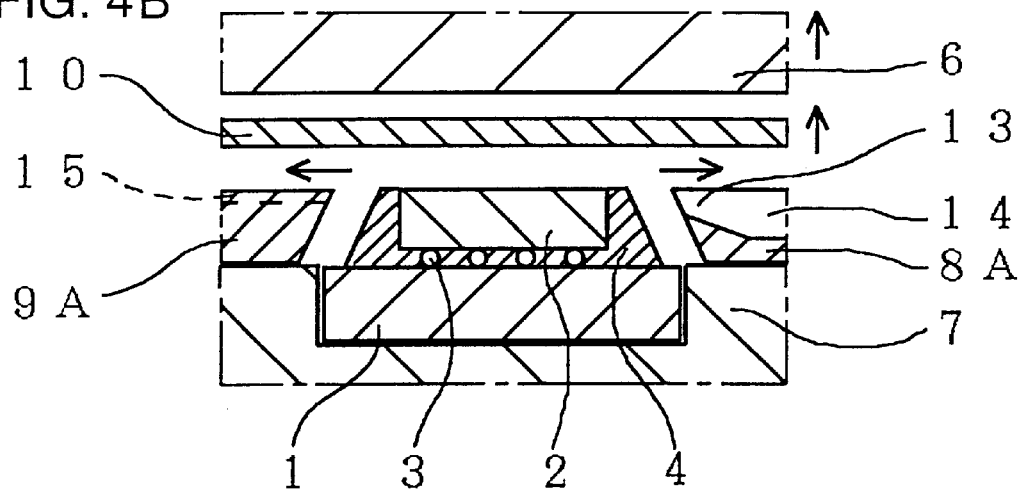
Figure 4C:
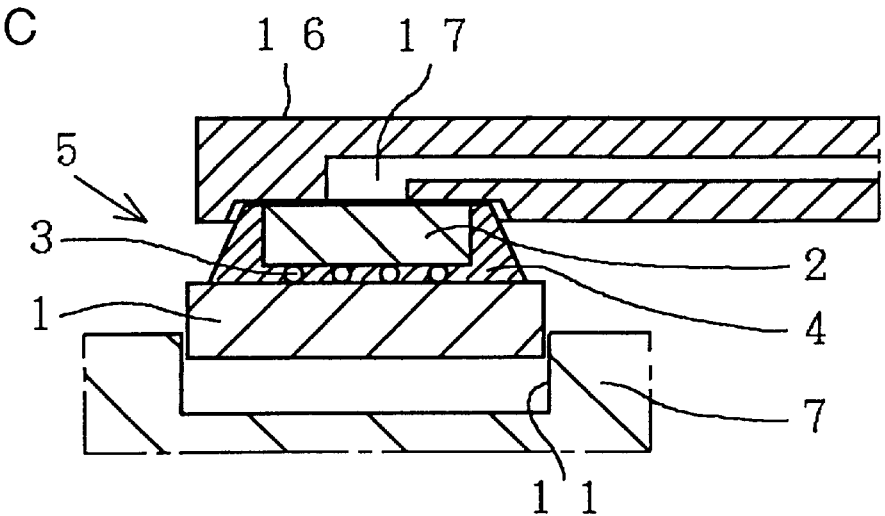

Reference will now be made to FIGS. 4A–4C to describe a process provided by the resin seal apparatus of the present embodiment, from the step of introducing melted resin through the step of extracting an electronic component.

As shown in FIG. 4A, with top die 6 pressing the top surfaces of intermediate dies 8A and 9A and the back surface of semiconductor chip 2 with resin film 10 posed therebetween, a plunger (not shown) is used to introduce melted resin into cavity 12 via resin channel 14 and gate 13, as indicated by the arrow in the figure. As the melted resin is introduced, the air in cavity 12 is exhausted, output from cavity 12 via an air vent.

Then, the dies are heated to heat the melted resin in cavity 12 for example to approximately 175° C. and cure the resin to form resin seal 4. Then, as shown in FIG. 4B, top die 6 moves upward to open top die 6 and bottom die 7 and resin film 10 is moved upward and thus removed from the back surface of semiconductor chip 2 and the top surfaces of intermediate dies 8A and 9A. Furthermore, intermediate dies 8A and 9A move along the parting plane of bottom die 7 away from resin seal 4.

Then, as shown in FIG. 4C, a chuck 16 moves and it is thus positioned on electronic component 5. Chuck 16 sucks electronic component 5 via a sucking tubing 17, extracts electronic component 5 from recess 11 and transports electronic component 5 to a predetermined position, such as a tray.

Thus the present embodiment provides an electronic component including resin seal 4 transfer-molded and exposing a back surface of semiconductor chip 2. As such, melted resin introduced into cavity 12 can cure to allow completed resin seal 4 to have dimensions with significantly satisfactory and constant precision. Since semiconductor chip 2 has an exposed back surface it can provide an enhanced heat sink effect when electronic component 5 is used.

Furthermore, the present embodiment can provide a resin seal method and apparatus employing transfer-molding to exert pressure on melted resin to introduce the resin into cavity 12 so as to provide a resin seal in a reduced period of time.

Furthermore, melted resin is introduced into and thus cures in cavity 12 defined by intermediate dies 8A and 9A and resin film 10 and thus formed to contain semiconductor chip 2. As such, if less viscous resin is used to ensure that melted resin is introduced into a gap provided between PCB 1 and semiconductor chip 2, the melted resin does not ingress into the gaps provided between top die 6 and intermediate dies 8A and 9A.

Furthermore, an inexpensive, solid resin tablet that is heated, melted can be used. As such, the source material can be readily stored and handled to facilitate controlling its viscosity in the process and also reduce the cost for the material.

Second Embodiment

Figure 5:
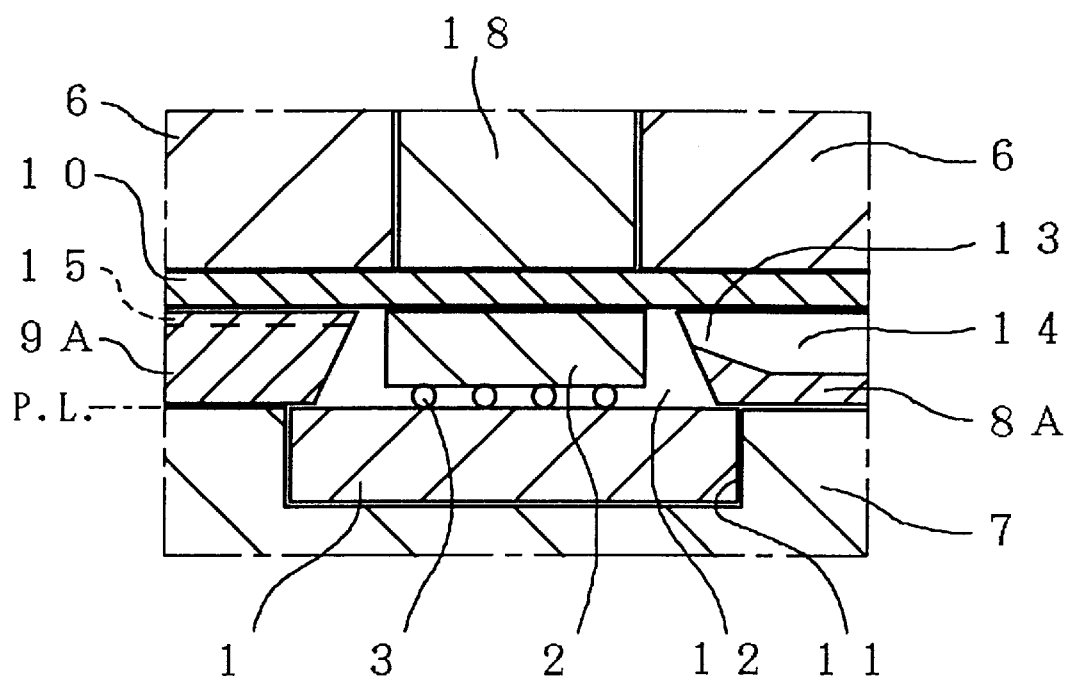
FIG. 5 is a cross section of a resin seal apparatus in a second embodiment of the present invention in a closed position.

Reference will now be made to FIG. 5 to describe a resin seal apparatus and method in a second embodiment of the present invention. In the present embodiment, top die 6 has a throughhole provided with a die 18 for a chip operating independently of top die 6.

The FIG. 5 apparatus operates as follows: initially, with resin film 10 stretched tight over a back surface of semiconductor chip 2 and a top surface of intermediate die 8A and that of intermediate die 9A, die 18 for a chip moves downward to press the back surface of semiconductor chip 2 with resin film 10 posed therebetween. Then, top die 6 moves downward to press the top surfaces of intermediate dies 8A and 9A with resin film 10 posed therebetween.

The present embodiment can provide a resin seal apparatus that is not only as effective as the first embodiment but also effective as follows:

First of all, semiconductor chip 2 has its back surface pressed by die 18 for a chip that is provided independently of top die 6 pressing the top surfaces of intermediate dies 8A and 9A. As such, semiconductor chip 2 can be pressed with appropriate pressure. As such, solder bump 3 can be free from pressure otherwise applied more than required and thus softening and deforming the bump when melted resin that is introduced is heated to approximately 175° C. and cured to form resin seal 4.

Furthermore, with resin film 10 interposed, die 18 for a chip can presses semiconductor chip 2 before top die 6 presses intermediate dies 8A and 9A. As such, resin film 10 can be free of wrinkle in a region defining cavity 12. Thus the electronic component can aesthetically be less defective.

Third Embodiment

Figure 6:
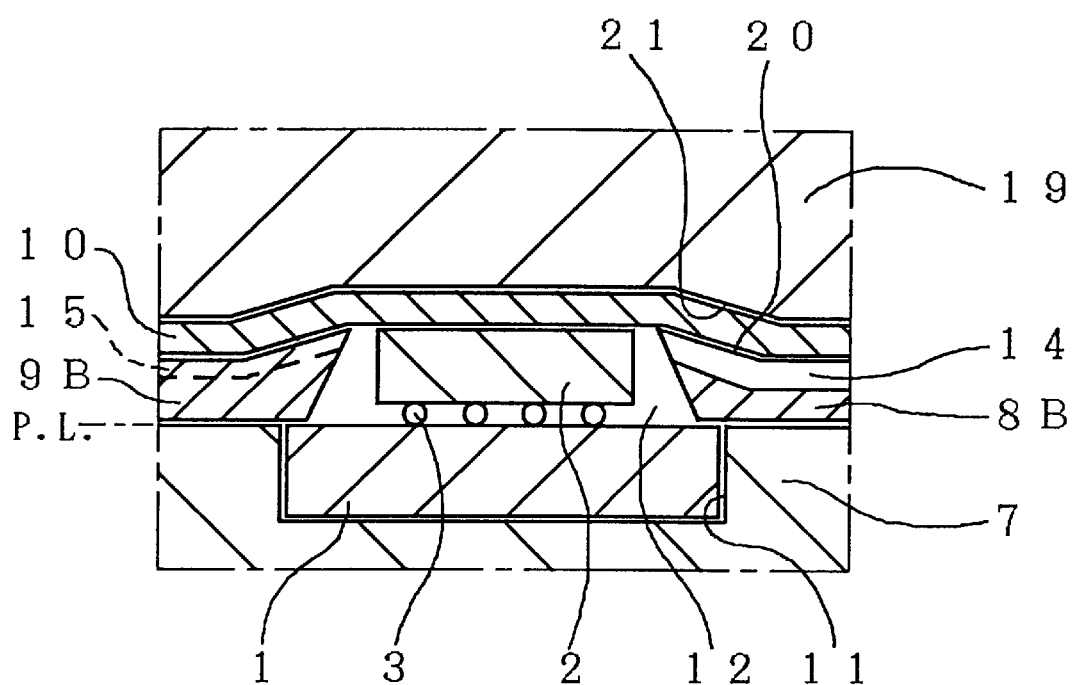
FIG. 6 is a cross section of a resin seal apparatus in a third embodiment of the present invention in a closed position.

Reference will now be made to FIG. 6 to describe resin seal apparatus and method in a third embodiment of the present invention. In the present embodiment, intermediate dies 8B and 9B have an inclination 20 and top die 19 has a parting surface facing inclination 20 and provided with an inclination 21. Inclinations 20 and 21 are provided annularly to surround semiconductor chip 2. Inclinations 20 and 21 are positioned and angled to allow resin film 10 to be sandwiched between inclinations 20 and 21 when the dies are clamped.

In the FIG. 6 apparatus operation, immediately before the dies are completely clamped, as top die 19 moves downward inclinations 20 and 21 sandwich and thus stretch resin film 10 tight. This ensures that resin film 10 can be free of wrinkle in a region defining cavity 12. Thus the electronic component can aesthetically be further less defective.

Fourth Embodiment

The present invention in a fourth embodiment provides an electronic component, as described with reference to FIGS. 7 and 8.

Figure 7:
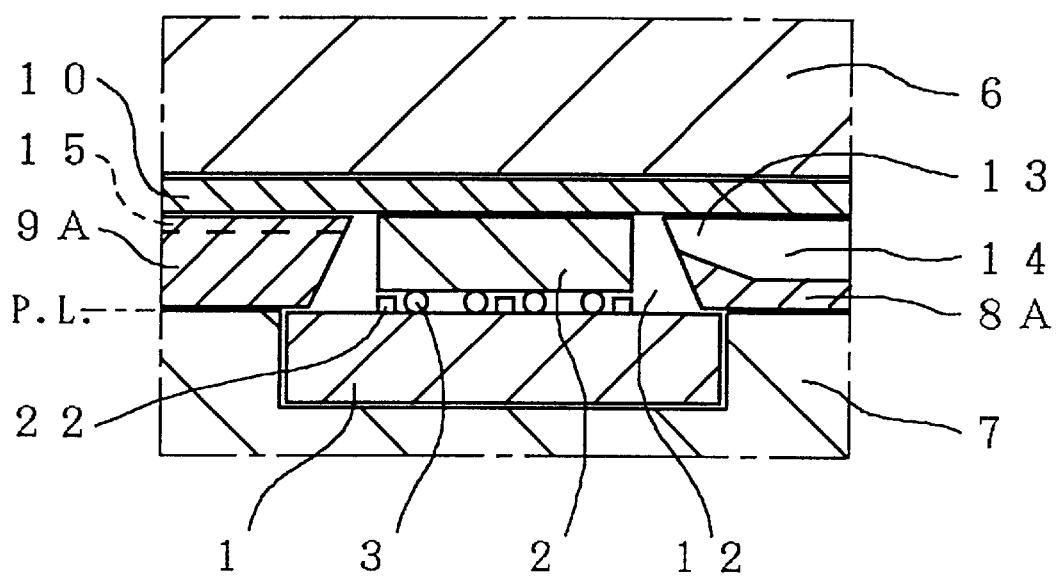
FIG. 7 is a cross section showing a condition immediately before introducing melted resin into a cavity in sealing with resin an electronic component in a fourth embodiment of the present invention.

With reference to FIG. 7, an electronic component includes PCB 1 having a top surface provided with a protrusion 22. Protrusion 22 is formed of a material which does not soften at a temperature applied to heat and thus melt solder bump 3 in the step of mounting semiconductor chip 2 onto PCB 1 via bump 3 nor at a temperature applied to heat and cure melted resin in the step of sealing the chip with the resin. Protrusion 22 is dimensioned to protrude to be level with or slightly lower in height than bump 3.

Protrusion 22 is provided for example by processing PCB 1, as follows: more specifically, on PCB 1 in a region free of any wiring pattern at a dummy pattern formed of Cu, Cu is plated to have a predetermined thickness and thus adheres thereto to provide protrusion 22. Alternatively, a refractory source material of resin, such as polyimide, that is previously formed in a lattice may be placed on POB 1. Alternatively, a refractory source material of resin may be screen-printed on PCB 1 in the form of a lattice.

As such, if in the step of sealing semiconductor chip 2 with resin when melted resin is heated and cured bump 3 softens, the pressure received by bump 3 via semiconductor chip 2 is also distributed to and thus applied on protrusion 22, and the gap between PCB 1 and semiconductor chip 2 would never be smaller than the height of protrusion 22. This can prevent softened bump 3 from deforming and, in the worst case, short-circuiting with adjacent bump 3.

While as described in the present embodiment protrusion 22 is provided on PCB 1, alternatively or in addition thereto protrusion 22 may be provided on a surface of semiconductor chip 2 that is provided with bump 3.

Fifth Embodiment

Figure 8:
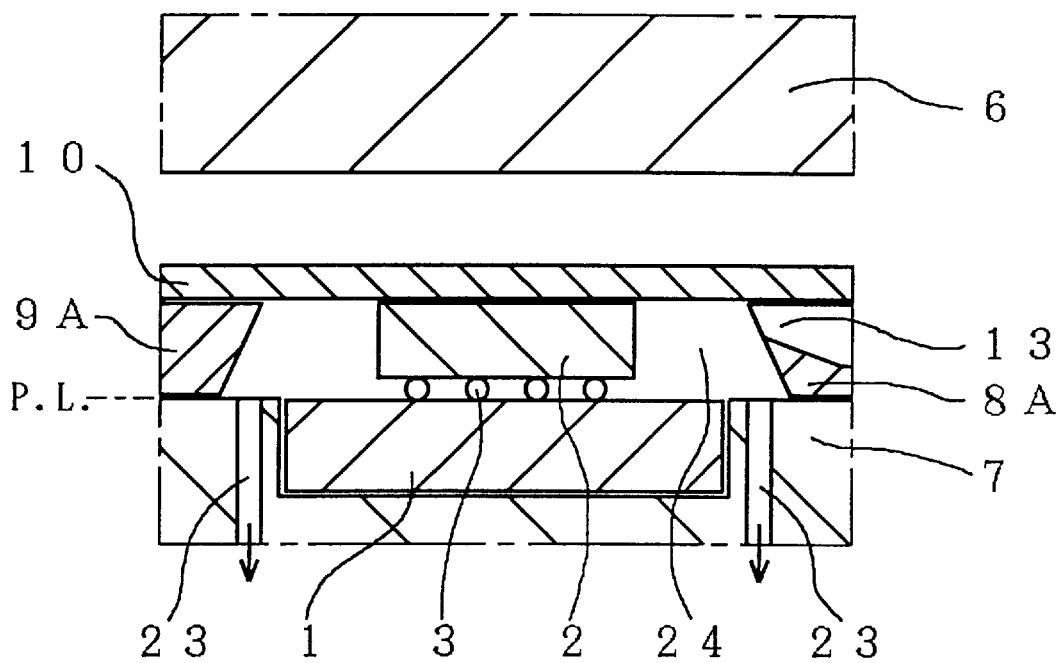
FIG. 8 is a cross section showing a condition before closing a resin seal apparatus in a fifth embodiment of the present invention.

Reference will now be made to FIGS. 3A–3C, 4A–4C and 8 to describe a resin seal apparatus and method in a fifth embodiment of the present invention. FIG. 8 is a cross section of the resin seal apparatus of the present embodiment before it is closed. In the present embodiment, a vacuum mechanism is provided to vacuum cavity 12.

In the present embodiment, as shown in FIG. 8, bottom die 7 is provided with an exhaust tubing 23 connected to a vacuum pump (not shown), and PCB 1, intermediate dies 8A and 9A and resin film 10 together define a closed space 24.

The resin seal apparatus of the present embodiment operates, as follows: initially, with reference to FIG. 3A, before intermediate dies 8A and 9A are moved, resin film 10 is brought into contact with a back surface of semiconductor chip 2 and a top surface of each of intermediate dies 8A and 9A. Then, closed space 24 is vacuumed via exhaust tubing 23. Then, intermediate dies 8A and 9A are moved to form cavity 12 as shown in FIG. 3C and the apparatus thereafter operates as shown in FIGS. 4A–4C.

Thus, cavity 12 previously vacuumed receives melted resin at low pressure. This allows less viscous melted resin to be used. As such, the present embodiment ensures underfilling semiconductor chip 2 in the form of a flip chip if PCB 1 and semiconductor chip 2 have a small gap therebetween and there are also a large number of bumps 3. In addition the present embodiment can also limit occurrence of a void in the resin seal.

Sixth Embodiment

Figure 9:
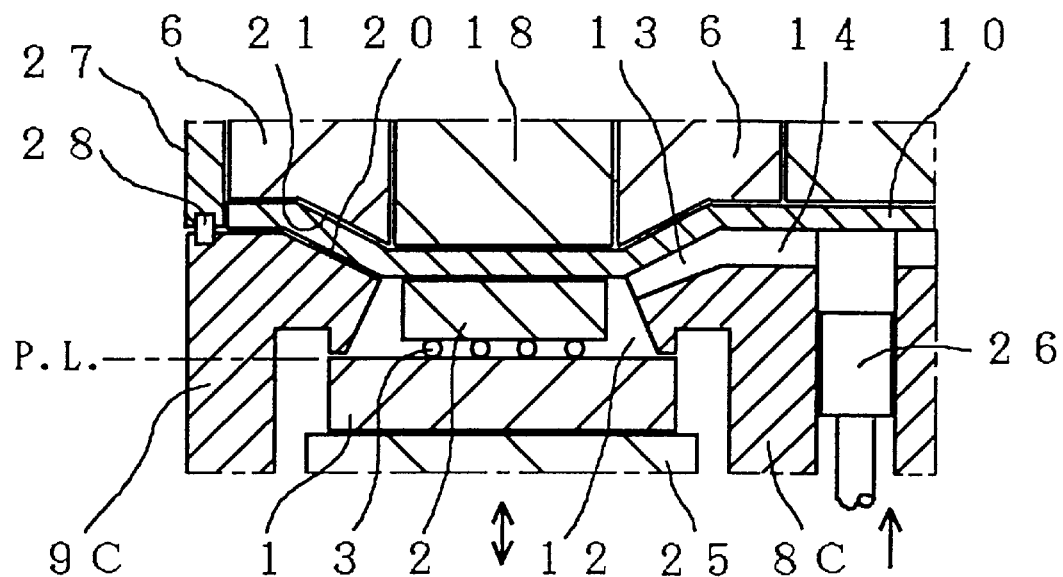
FIG. 9 is a cross section showing a condition after closing a resin seal apparatus in a sixth embodiment of the present invention.
Figure 10:
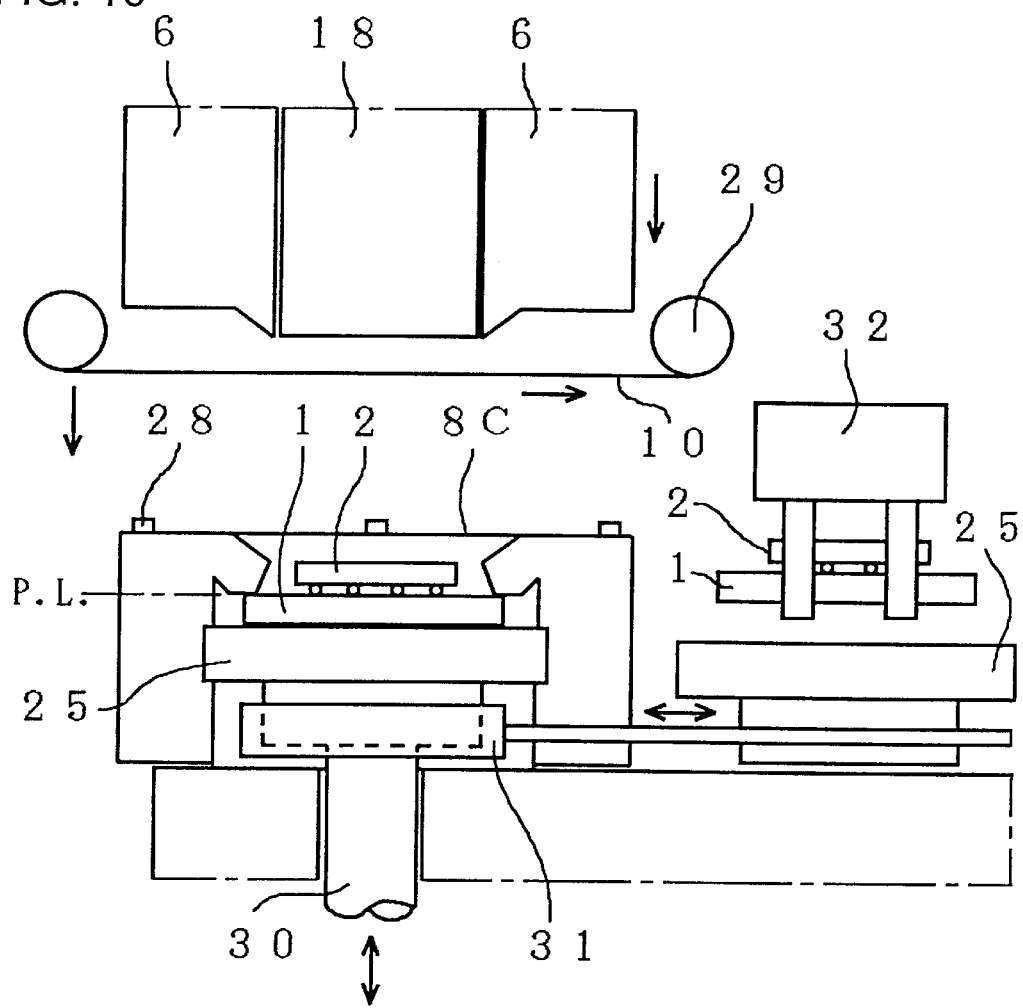
FIG. 10 illustrates a general configuration of a resin seal apparatus shown in FIG. 9.

Reference will now be made to FIGS. 9 and 10 to describe a resin seal apparatus and method in a sixth embodiment of the present invention.

The present embodiment provides a resin seal apparatus, as shown in FIG. 9, including intermediate dies 8C and 9C fixed in contact with a periphery of PCB 1, and also including a movable bottom die 25 mounting PCB 1 thereon and capable of ascending and descending, a plunger 26 pushing and thus introducing melted resin (not shown) into cavity 12, a sealing block 27 provided to seal cavity 12 against the atmosphere external thereto, and a sealing member 28 provided between intermediate die 9C and sealing block 27.

The FIG. 9 apparatus operates, as follows: initially, movable bottom die 25 with PCB 1 placed thereon moves upward to allow a top surface of PCB 1 to impinge onto a bottom surface of intermediate die 8C and that of intermediate die 9C. Then, cavity 12 is vacuumed and sealing block 27 is then moved downward and die 18 for a chip and top die 6 are also successively moved downward. Thus, resin film 10 provided across the plane of FIG. 9 can be stretched tight by inclinations 20 and 21 to be free of wrinkles.

Then, cavity 12 defined by PCB 1, intermediate dies 8C and 9C and resin film 10 receives melted resin introduced by plunger 26 and the introduced melted resin is cured to form a resin seal. Then, movable bottom die 25 is moved downward and the resin seal is removed from intermediate dies 8C and 9C and an electronic component is then extracted.

The resin seal apparatus of the present embodiment, as generally configured, as shown in FIG. 10, includes a mechanism 29 feeding resin film 10 to span over intermediate die 8C and semiconductor chip 2, and a mechanism 30 allowing movable bottom die 25 to ascend and descend, a mechanism 31 horizontally moving movable bottom die 25 to extract an electronic component, and a loader/unloader 32 feeding PCB 1 onto movable bottom die 25 and also transporting an electronic component to a tray.

Thus the present embodiment can employ transfermolding to exert pressure on melted resin to introduce the resin into cavity 12 so as to seal a chip with the resin in a reduced period of time.

Furthermore, if less viscous resin is used to ensure that melted resin is introduced into a gap provided between PCB 1 and semiconductor chip 2 the melted resin can be prevented from entering gaps between top die 6 and intermediate dies 8C and 9C.

Furthermore, an inexpensive, solid resin tablet heated and thus melted can be used. As such, the source material can be readily stored and handled, its viscosity can be readily controlled in the process and its cost can also be reduced.

Furthermore, resin film 10 can be free of wrinkles in a region defining cavity 12, to provide an aesthetically less defective electronic component.

Furthermore, vacuuming cavity 12 allows melted resin to be introduced with low pressure. This ensures underfilling semiconductor chip 2 in the form of a flip chip. This can also prevent occurrence of a void otherwise created in a resin seal.

While in each of the embodiments described hereinbefore a single semiconductor chip is mounted on a single PCB, the present invention is similarly applicable if a plurality of semiconductor chips are mounted on a single PCB and after they are sealed with resin the PCB is divided to provide a plurality of electronic component.

Furthermore, while a single cavity is provided for a single plunger, a plurality of cavities may alternatively be provided for a single plunger.

Seventh Embodiment

A seventh embodiment of the present invention will now be described with reference to FIGS. 11–14.

The present embodiment, as shown in FIGS. 11–14, provides the step of bringing a mold release film in close contact with a surface of a semiconductor chip 117. In this step, a die cavity 118 receives fluid pressure which is applied via a mold release film 111 to at least a member attaching surface A of semiconductor chip 117 fit and thus set in cavity 118, to press mold release film 111 into close contact with member attaching surface A of semiconductor chip 117.

The step of bringing the mold release film in close contact with the surface of semiconductor chip 117 is followed by the step of introducing resin. In this step, die cavity 118 receives a pressurized and thus introduced, sealing source material of resin to introduce melted source material of resin R to cover a surface of semiconductor chip 117 excluding at least member attaching surface A thereof and fill a gap provided between semiconductor chip 117 and PCB 115.

Thus, resin can be efficiently introduced and fill a gap provided between semiconductor chip 117 in the form of a flip chip and PCB 115. This can enhance productivity as well as efficiently prevent the introduced melted source material of resin R from adhering to semiconductor chip 117 on member attaching surface A, such as a heat sink, when the resin is introduced and thus fills the gap provided between semiconductor chip 117 and PCB 115.

Figure 11:
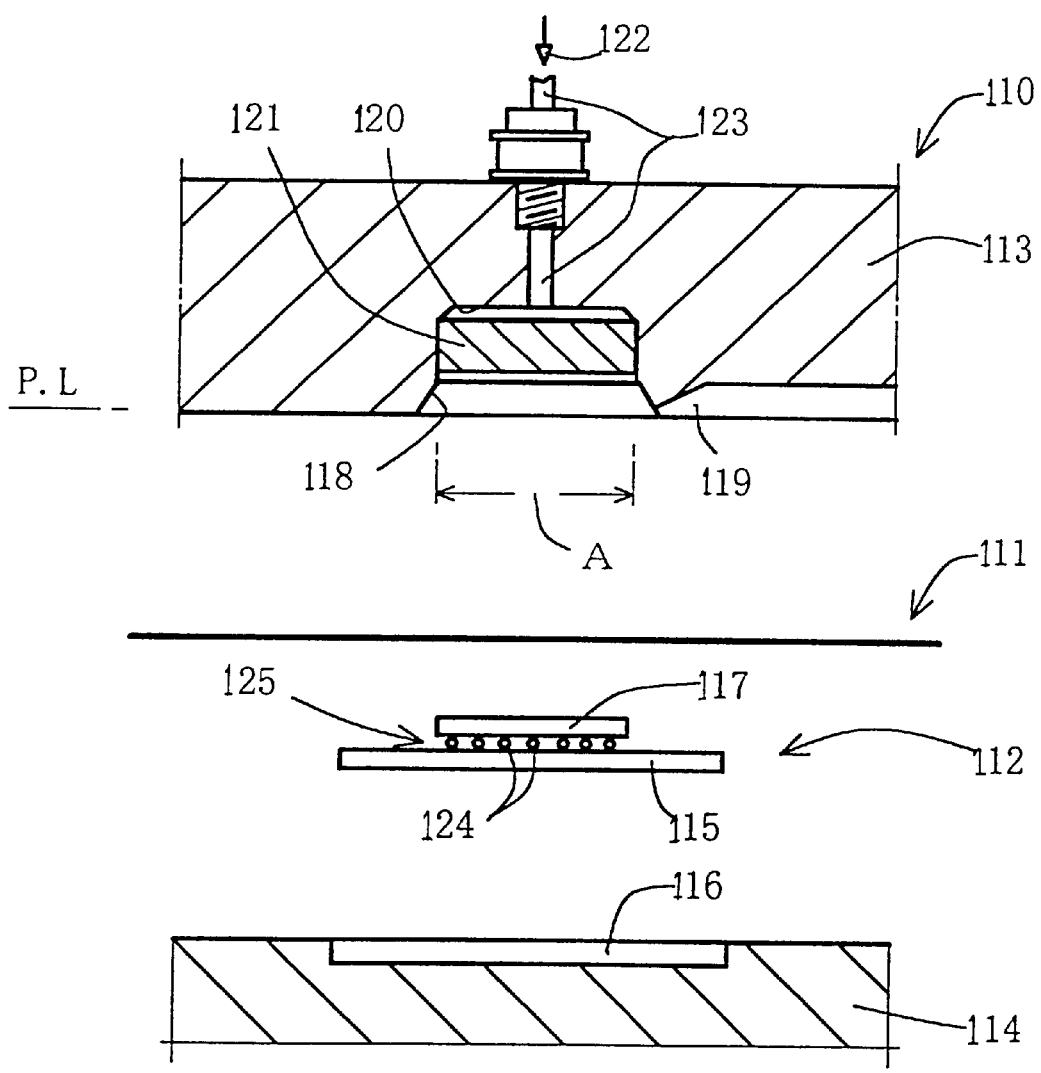
FIG. 11 is a vertical cross section schematically showing a main portion of a resin receiving die in a seventh embodiment of the present invention, opened, with a mold release film and a flip chip interposed before resin is introduced and molded, as seen in a developed view.

FIG. 11 schematically shows a die 110 receiving resin to mold a flip chip with the resin, and mold release film 111 fed between opened dies and a flip chip 112 before it is molded with resin.

Furthermore, the resin receiving die is defined by a fixed top die 113 and a movable bottom die 114 arranged opposite to fixed top die 113 and vertically moved by an appropriate vertically driving mechanism (not shown).

Furthermore, bottom die 114 has a parting surface provided with a recess 116 receiving and fitting PCB 115 of flip chip 112 thereinto to set PCB 115 therein, and top die 113 has a parting surface provided with cavity 118 receiving and thus fitting and thus setting therein semiconductor chip 117 mounted on PCB 115 of flip chip 112 and a gate 119 passing a pressurized and thus introduced, sealing, melted source material of resin to cavity 118.

Note that gate 119 is connected to communicate with a resin channel transporting melted source material of resin R, the resin channel is connected to communicate with a pot supplying the source material of resin when top and bottom dies 113 and 114 are clamped together, and that when a plunger fit into the pot exerts pressure the source material of resin heated and melted in the pot receives pressure and it is thus introduced into cavity 118 through the resin channel and gate 119.

Furthermore, in top die 113 cavity 118 is adjacent to an attachment 120 provided with a vent member 121 which is resistant to heat and keeps a form, as required. Furthermore, attachment 120 is connected to communicate via an appropriate gas feeding channel 123 with a mechanism provided to compress and thus deliver gas 122 into attachment 120.

Thus, when the gas compression and delivery mechanism operates, gas 122 is compressed and thus delivered to attachment 120 via gas feeding channel 123 and gas 122 thus delivered is immediately fed through pressure into cavity 118 via vent member 121.

Furthermore, vent member 121 can be detachably attached to attachment 120 and vent member 121 can thus be readily exchanged.

Note that gas 122 may be air, gaseous nitrogen and any other appropriate gas, and vent member 121 may for example be of a material having successive pores capable of passing gas 122 or it may be provided in the form of a large number of tubes for passing gas.

Furthermore, mold release film 111 spans across the parting surfaces of the top and bottom dies heated to a temperature applied to mold resin and it is accordingly formed of a material that is at least resistant to heat, flexible and has excellent removability with respect to the parting surfaces of the top and bottom dies, as required, and, as will be described hereinafter, when the top and bottom dies are clamped together the film can span along the geometry of the parting surfaces of the dies adjoined and thus clamped and after resin has been introduced and molded the film can be readily removed from the parting surfaces of the dies.

Although not shown in the figure, known feeding and winding rolls are used to provide mold release film 111 between top and bottom dies 113 and 114, and an appropriate input and output mechanism is used to feed the film automatically to a predetermined position between the top and bottom dies before resin is introduced to mold a flip chip, and also to wind the film up and transport and output it from the top and bottom dies after the flip chip is molded with the injected resin.

Furthermore in flip chip 112 PCB 115 and semiconductor chip 117 are electrically connected together by a bump 124 and PCB 115 and semiconductor chip 117 thus have a small gap 125 therebetween.

Although not shown in the figure, a known input and output mechanism is used to automatically feed flip chip 112 onto bottom die 114 to set it in recess 116 before resin is introduced and the flip chip is thus molded therewith, as will be described hereinafter, and also to extract the flip chip from recess 116 and automatically transport and output it from the top and bottom dies after the flip chip is molded with the injected resin.

Top and bottom dies 113 and 114 are used in introducing resin to mold flip chip 112 therewith, as will now be described.

Initially, appropriate heating means is used to heat top and bottom dies 113 and 114 to a temperature for molding a chip with resin. Then, the vertically driving mechanism is used to move bottom die 114 downward and thus away from top die 113, as shown in FIG. 11. Then, the flip chip feeding mechanism is employed to fit PCB 115 of flip chip 112 into recess 116 of bottom die 114. Simultaneously or not simultaneously with the step of feeding a flip chip a source material of resin in the pot is supplied. Furthermore, simultaneously or not simultaneously with the step of feeding a flip chip or feeding a source material of resin the mechanism feeding and outputting the mold release film is used to allow mold release film 111 wound around a feeding roll to be fed to a predetermined position between the top and bottom dies.

Figure 12:
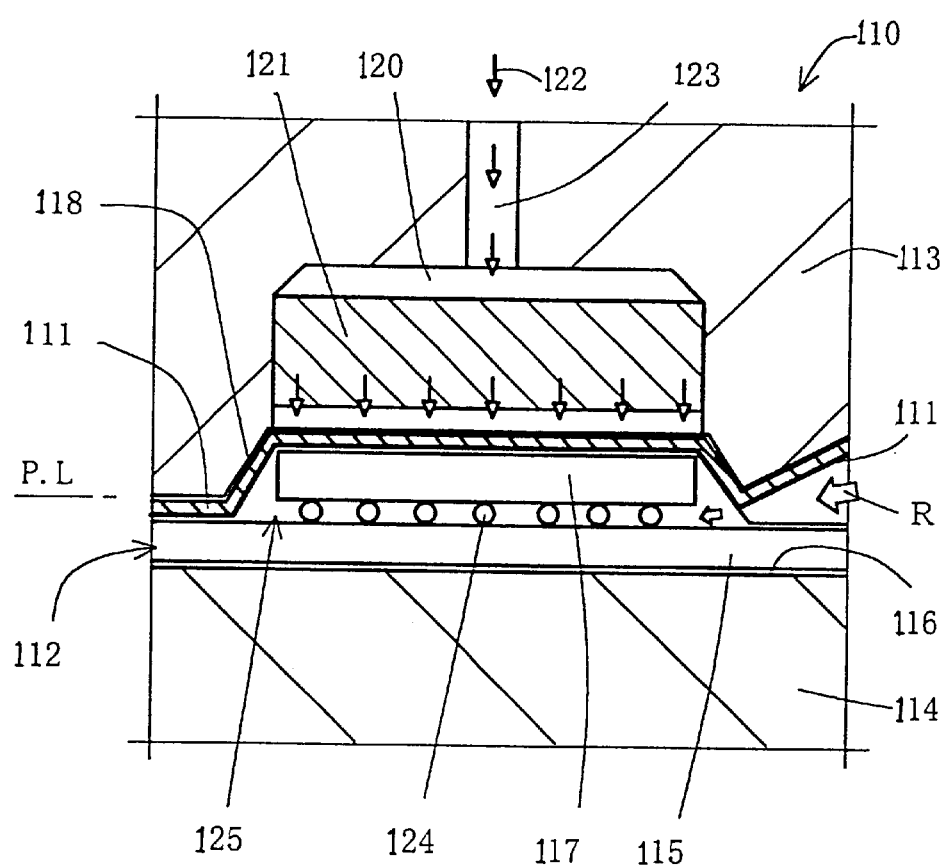
FIG. 12 is a vertical cross section enlarging the main portion of the resin receiving die of the seventh embodiment, for illustrating an effect of introducing and molding resin.

Then, the vertically driving mechanism is used to move bottom die 114 upward to join and thus clamp top and bottom dies 113 and 114 together, as shown in FIG. 12. In this step, due to its flexibility, mold release film 111 adjoins and thus covers PCB 115 of flip chip 112 and a surface of semiconductor chip 117 and the film is also stretched along the geometry of the parting surface of top die 113. Furthermore, that portion of semiconductor chip 117 covered with mold release film 111 is fit into cavity 118 of top die 113. As such, in the step of clamping the top and bottom dies a flip chip can be set in the dies such that semiconductor chip 117 can be fit into cavity 118 of top die 113 with mold release film 111 covering PCB 115 of flip chip 112 and a surface of semiconductor chip 117.

Then the gas compression and delivery mechanism operates to compress and deliver gas 112 to attachment 120 via gas feeding channel 123 of top die 113 and further deliver gas 122 through pressure to cavity 118 via vent member 121. Thus, gas 122 provides fluid pressure applied via mold release film 111 to semiconductor chip 117 at least on member attaching surface A, such as a heat sink, which, as shown in the figure by way of example, corresponds to a top surface of semiconductor chip 117 that is denoted in FIG. 11 by a reference character A, to press and thus bring mold release film 111 into close contact with semiconductor chip 117 on member attaching surface A.

Then when the plunger exerts pressure a source material of resin heated and thus melted in the pot is pressurized and thus introduced through the resin channel and gate 119 to cavity 118. Since semiconductor chip 117 has at least member attaching surface A pressed by mold release film 111 in close contact therewith, the source material of resin introduced into cavity 118 is introduced and covers a surface of semiconductor chip 117 fit in cavity 118 excluding at least member attaching surface A of the chip and fills gap 125 provided between the chip and PCB 115.

Then, the vertically driving mechanism is employed to move bottom die 114 again downward and thus away from top die 113 to open top and bottom dies 113 and 114. Herein, top die 113 has its parting surface with mold release film 111 spanning thereacross and flip chip 112 molded with the injected resin can thus be readily removed from the top die's cavity 118. The removal of flip chip 112 from the die can be facilitated by operating the gas compression and delivery mechanism to compress and thus supply gas 122 into cavity 118 when the top and bottom dies are opened.

Then, the mechanism feeding and outputting the mold release film is used to wind up mold release film 111 around a winding roll and thus transport and output the film from the top and bottom dies after the chip is molded with injected resin, and the mechanism feeding and outputting flip chip 112 is used to extract resin-molded flip chip 112 from the bottom die 114 recess 116 and transport and output the chip from the top and bottom dies.

Figure 13:
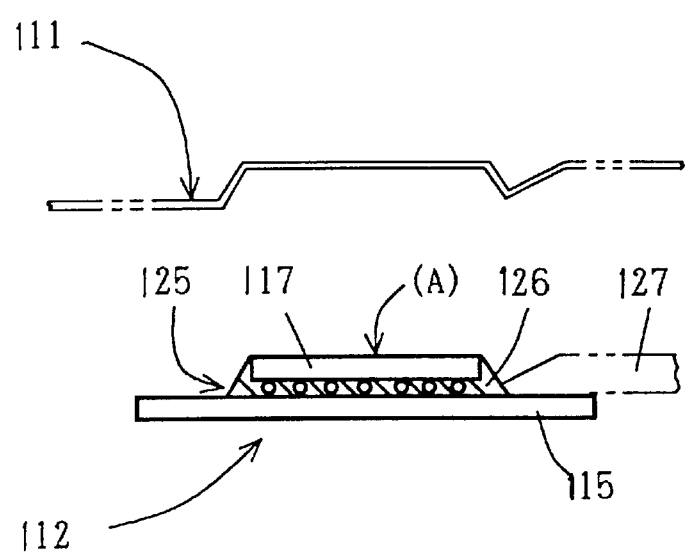
FIG. 13 is a partially notched, front view of a flip chip after it is molded with resin introduced into the die of the seventh embodiment.
Figure 14:
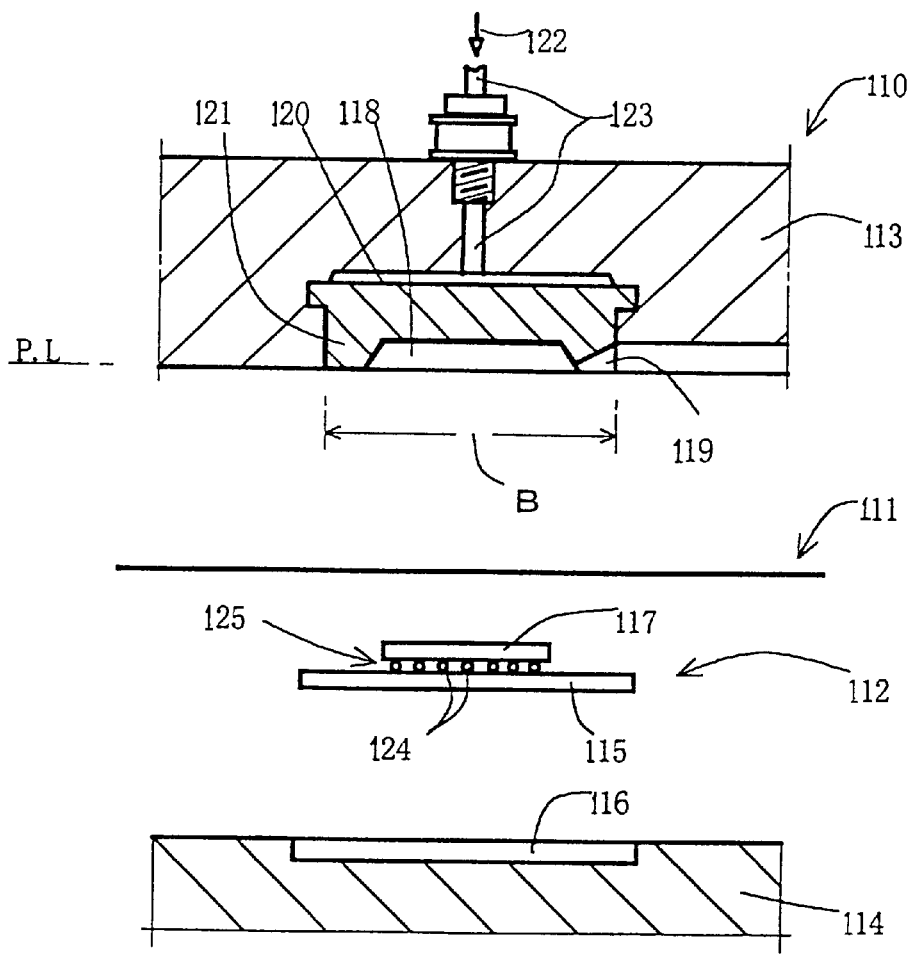
FIG. 14 is a vertical cross section of the main portion of the die of the seventh embodiment, opened, with a mold release film and a flip chip interposed before resin is introduced and molded, as seen in a developed view, for illustrating another effect of introducing and molding resin.

Flip chip 112 extracted from the bottom die 114 recess 116 has cured resin 126 integrally adhering to a surface of semiconductor chip 117 excluding at least member attaching surface A thereof and gap 125 provided between semiconductor chip 117 and PCB 115 and it also has residual cured resin 127 integrally adhering to a (top) surface of PCB 115 corresponding to the resin channel and gate 119, as shown in FIG. 13. Note that residual cured resin 125 is not required for a product and it is thus separated and removed from PCB 115, as appropriate.

Such a series of process steps can efficiently introduce resin and fill therewith gap 125 provided between semiconductor chip 117 and PCB 115 of flip chip 112. As a result, not only can productivity be significantly increased but the series of steps can efficiently prevent resin introduced to fill gap 125 from adhering to semiconductor chip 117 on member attaching surface A such as a heat sink. This ensures that in a subsequent step the heat sink or a similar member can be efficiently bonded to member attaching surface A.

Furthermore, the mold release film may be brought into contact with a surface of semiconductor chip 117 with any type of fluid that can act and function to exert fluid pressure onto the surface of semiconductor chip 117 via mold release film 111 to press the film to bring it in close contact with semiconductor chip 117 on at least member attaching surface A.

Furthermore, such fluid pressure may be pressure applied to mold resin.

For example alternatively in top die 113 attachment 120 adjacent to cavity 118 may be used as a cavity for providing a resin mold having a required thickness and the mechanism compressing and thus transporting gas to attachment 20 and channel 23 feeding gas to the attachment may be used as a mechanism heating and melting a source material of resin and a channel passing the melted source material of resin. In this example, vent member 121 can be dispensed with.

Thus with such a configuration as above when the top and bottom dies are clamped together attachment 120 provides a cavity receiving a melted source material of resin pressurized and thus introduced thereinto to form in the cavity a resin mold having a required thickness, As such, semiconductor chip 117 has surface A receiving via mold release film 111 a required level of pressure applied to mold the melted source material of resin pressurized and thus introduced into the cavity. As a result, semiconductor chip 117 can have the surface in close contact with the mold release film. As such in this condition a source material of resin can be pressurized and thus introduced into cavity 118 to introduce the resin to cover therewith a surface of semiconductor chip 117 excluding at least member attaching surface A thereof and fill therewith gap 125 provided between semiconductor chip 117 and PCB 115.

Note that resin cured and molded in the attachment 120 cavity can be removed as required for each molding cycle.

Furthermore in each embodiment the mold release film may be brought into contact with semiconductor chip surface A with fluid pressure adapted to be adjustable to correspond to pressure applied to introduce resin.

For example, the mold release film may be brought into close contact with surface A with fluid pressure that can appropriately and automatically vary for different levels of pressure applied to introduce resin.

Furthermore in each embodiment the mold release film may be brought into close contact with semiconductor chip surface A with fluid pressure set to be lower in level than pressure applied to introduce resin, to ensure that the film is brought into close contact with surface A.

Furthermore, in each embodiment when resin is introduced, with mold, release film 111 stretched across the parting surfaces of the top and bottom dies, cavity 118 (a portion filled with the resin) is blocked from the outside and air can hardly communicate from inside to outside and vice versa. As such, when the top and bottom dies are clamped together, cavity 18 tends to have residual air or residual burnt gases generated when a source material of resin is heated and melted, and, attributed thereto, the resin may fail to completely fill gap 125 of flip chip 112 or air bubbles or other disadvantages may result in a resin mold.

Such disadvantages can be overcome simply for example by vacuuming a portion to be filled with resin including at least cavity 118 when the resin is introduced.

This step is advantageous as vacuuming at least cavity 118 (a portion to be filled with resin) to externally exhaust air or the like advantageously ensures that resin can be efficiently introduced to fill gap 125 of flip chip 112 and also prevents the resin from failing to fill gap 125 and also prevents air bubbles.

Furthermore while in each embodiment a member attaching surface A such as a heat sink corresponds to a top surface of semiconductor chip 117, it is not limited thereto.

Furthermore, while the mold release film is brought into close contact with a surface of the semiconductor chip with fluid pressure applied to member attaching surface A via mold release film 111 to press the same, the range pressed by such fluid pressure is not limited to that as shown in FIG. 11. More specifically, the fluid pressure may be applied to cover a range extended to cover a surface of PCB 115 of flip chip 112, as denoted by reference character B in FIG. 14.

In this example, the fluid pressure can cover a surface of PCB 115 via mold release film 111. This can advantageously prevent disadvantages such as resin flash otherwise disadvantageously resulting on the surface of PCB 115 when a source material of resin pressurized and thus introduced into cavity 118 flows out of cavity 118.

Furthermore, gas 122 when the top and bottom dies are clamped together, as shown in FIG. 12, is compressed and thus supplied through vent member 121 to cavity 118. Vent member 121 passing compressed air 122 and mold release film 111 have therebetween a gap set as desired, although required to prevent vent member 121 and mold release film 111 from contacting each other when the top and bottom dies are clamped together.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of sealing with resin a semiconductor chip mounted on a printed circuit board, to fabricate an electronic component, comprising the steps of:

preparing a resin molding die divided into a main die and an intermediate die opened and closed, as desired, relative to said main die in arrangement;

setting in any of said main die at a predetermined position said printed circuit board with said semiconductor chip mounted thereon;

closing said main die with said semiconductor chip set therein and said intermediate die together, and also adjoining together said intermediate die and a periphery of said printed circuit board in said main die to clamp said molding die;

after the step of closing and adjoining, stretching a mold release film over a back surface of said semiconductor chip and a front surface of said intermediate die;

after the step of stretching, closing together another said main die and said intermediate die with said mold release film posed therebetween, to further clamp said molding die;

pressing said mold release film into close contact with the back surface of said semiconductor chip;

at the step of closing together another said main die and said intermediate die and the step of pressing, introducing melted resin into a cavity and curing the introduced resin therein to seal with the resin said semiconductor chip mounted on said printed circuit board, said cavity being defined by said printed circuit board, said intermediate die and said mold release film;

after said semiconductor chip is molded with resin, opening said molding die; and removing said mold release film stretched across the back surface of said semiconductor chip and the front surface of said intermediate die.

2. The method of claim 1, wherein the step of closing another said main die and said intermediate die and the step of pressing are provided separately.

3. The method of claim 1, wherein said intermediate die and said another main die are closed together by adjoining their respective surfaces unleveled, as required, to allow said dies, when closed together, to remove a wrinkle of at least said mold release film stretched across the back surface (a heat-sink surface) of said semiconductor chip.

4. The method of claim 1, further comprising the step of internally vacuuming at least said cavity before the step of introducing.

5. A method of introducing resin for a flip chip, said flip chip being formed of a semiconductor chip and a printed circuit board connected together via a bump, said flip chip being set in a resin molding die at a predetermined position, the resin being introduced into a gap provided between said semiconductor chip and said printed circuit board, comprising the steps of:

with said printed circuit board and said semiconductor chip each having a surface covered with a mold release film, fitting said semiconductor chip into a cavity of said molding die to set said semiconductor chip therein;

adjoining opposite parting surfaces of said molding die together to close said molding die;

introducing fluid pressure into said cavity and exerting the fluid pressure via a mold release film onto at least a member attaching surface of said semiconductor chip in said cavity to press said mold release film into close contact with said member attaching surface;

after said mold release film is pressed into close contact with said member attaching surface, pressurizing and thus introducing a molding source material of resin into said cavity to cover with said resin a surface of said semiconductor chip excluding at least said member attaching surface and fill with said resin a gap provided between said semiconductor chip and said printed circuit board.

6. The method of claim 5, wherein in the step of introducing, said fluid is gas, said gas applying pressure toward a surface of said semiconductor chip via said mold release film to press said mold release film into close contact with said semiconductor chip at at least said member attaching surface.

7. The method of claim 5, wherein in the step of introducing, said fluid pressure is pressure applied to mold resin, said pressure applied to mold resin being applied toward a surface of said semiconductor chip via said mold release film to press said mold release film into close contact with said semiconductor chip at at least said member attaching surface.

8. The method of claim 5, wherein in the step of introducing, said fluid pressure is adapted to be adjustable to correspond to pressure applied to introduce resin in the step of pressurizing and introducing.

9. The method of claim 5, wherein the step of pressurizing and introducing includes the step of internally vacuuming a portion to be filled with resin, including at least a die cavity.

10. An apparatus for sealing with resin a semiconductor chip mounted on a printed circuit board, to fabricate an electronic component, comprising:

resin molding means including a first main die and another main die and an intermediate die that can be opened and closed, as desired, relative to said first main die in arrangement;

setting means for setting in any of said first main die and said another main die at a predetermined position said printed circuit board with said semiconductor chip mounted thereon;

closing and opening means for selectively closing and opening said first main die or said another main die with said semiconductor chip set therein and said intermediate die together, and also for adjoining together said intermediate die and a periphery of said printed circuit board in said first main die to clamp said resin molding means;

stretching means for stretching a mold release film over a back surface of said semiconductor chip and a front surface of said intermediate die;

pressing means for pressing said mold release film into close contact with the back surface of said semiconductor chip;

resin introducing means for introducing melted resin into a cavity and curing the introduced resin therein to seal with the resin said semiconductor chip mounted on said printed circuit board, said cavity being defined by said printed circuit board, said intermediate die and said mold release film; and removing means for removing said mold release film stretched across the back surface of said semiconductor chip and the front surface of said intermediate die.

11. The apparatus according to claim 10, wherein:

said resin molding means comprise a resin molding die divided into said first main die and said another main die and said intermediate die which can be opened and closed, as desired, relative to said first main die in arrangement;

said setting means comprise a printed circuit board feed and set mechanism feeding and setting in any of said first main die and said another main die at said predetermined position said printed circuit board having said semiconductor chip mounted thereon;

said closing and opening means comprise a first clamp mechanism closing said first main die with said semiconductor chip set therein and said intermediate die together, and also adjoining said intermediate die and said periphery of said printed circuit board set in said first main die;

said stretching means comprise a film stretch mechanism stretching said mold release film over said back surface of said semiconductor chip mounted on said printed circuit board set in said first main die at said predetermined position and over said front surface of said intermediate die;

said closing and opening means further comprise a second clamp mechanism closing together said another main die and said intermediate die with said mold release film posed therebetween;

said resin introducing means comprise a resin seal mechanism introducing said melted resin into said cavity with said first and second clamp mechanisms clamping said molding die, and curing the introduced resin therein to seal with the resin said semiconductor chip mounted on said printed circuit board, said cavity being defined by said printed circuit board, said intermediate die and said mold release film; and further comprising a printed circuit board transport mechanism transporting a resin-molded product from said predetermined position in said first main die of said molding die opened to output the resin-molded product from said molding die.

12. The apparatus according to claim 11, further comprising a die for a chip, pressing said mold release film into close contact with the back surface of said semiconductor chip.

13. The apparatus according to claim 11, further comprising a portion provided to remove a wrinkle of at least said mold release film stretched across the back surface of said semiconductor chip mounted on said printed circuit board, said portion corresponding to said intermediate die and said another main die each having an unleveled surface as required, adjoining each other to remove the wrinkle of said mold release film.

14. The apparatus according to claim 11, further comprising a vacuum mechanism internally vacuuming at least said cavity.

* * * * *